United States Patent [19]

Lee

[11] Patent Number: 5,068,168

[45] Date of Patent: Nov. 26, 1991

[54] STYRENE/MALEATES TERPOLYMERS

[75] Inventor: Kang I. Lee, Longmeadow, Mass.

[73] Assignee: Monsanto Company, St. Louis, Mo.

[21] Appl. No.: 630,657

[22] Filed: Dec. 20, 1990

[51] Int. Cl.$^5$ .................. G03C 1/76; C08F 218/16
[52] U.S. Cl. .................................. 430/270; 430/192; 430/176; 430/197; 430/905; 526/320
[58] Field of Search .............. 430/192, 197, 270, 905; 526/320

[56] References Cited

U.S. PATENT DOCUMENTS

| | | | |
|---|---|---|---|
| 3,288,842 | 11/1966 | Verdol | 526/320 |
| 3,317,483 | 5/1967 | Verdol | 526/320 |
| 3,342,787 | 9/1967 | Muskat | 260/78.5 |
| 3,446,783 | 5/1969 | Kay et al. | 260/78.5 |
| 3,563,937 | 2/1971 | Nickerson | 260/33.4 |
| 3,887,450 | 6/1975 | Gilano et al. | 204/159.15 |
| 4,511,640 | 4/1985 | Liu | 430/176 |
| 4,539,286 | 9/1985 | Lipson et al. | 430/277 |
| 4,659,642 | 4/1987 | Platzer et al. | 430/192 |

FOREIGN PATENT DOCUMENTS 2-178662A 11/1990 Japan .................. 430/270

Primary Examiner—Joseph L. Schofer
Assistant Examiner—Alex H. Walker
Attorney, Agent, or Firm—R. Bruce Blance; William J. Farrington; Richard H. Shear

[57] ABSTRACT

Terpolymers of styrene, mono-iso-butyl maleate and mono-2-(n-butoxy)ethyl maleate wherein the ratio of styrene units to maleate units is in the range of about 1:1 to about 1.6:1 and the ratio of mono-iso-butyl maleate units to mono-2-(n-butoxy)ethyl maleate is in the range of about 3:2 to about 1:3. The terpolymers are useful as alkali soluble binders for photoresist compositions.

6 Claims, No Drawings

STYRENE/MALEATES TERPOLYMERS

This invention relates to terpolymers of styrene and mono-maleates and in particular to terpolymers of styrene, mono-isobutyl maleate and mono-2-(n-butoxy)ethyl maleate.

Maleate copolymers of styrene have been used for textile and paper coating applications and as binders for dry film photoresists. The preferred copolymers have been the 1:1 copolymers of styrene and butyl or isobutyl maleate. These copolymers suffer from the disadvantages of film brittleness, the requirement of high temperatures for processability, and the tendency to degrade in processing and to inhibit the photoactivity of the photoresist composition.

Copolymers of styrene and mono-2-(n-butoxy)ethyl maleate suffer from cold flow and when incorporated into photoresist compositions impair the dimensional stability. Furthermore in preparation of such copolymers, difficulty in obtaining high molecular weight because of the pronounced tendency to gel, limits the binding efficiency of such copolymers.

These problems are overcome with terpolymers of styrene, mono-iso-butyl maleate and mono-2-(n-butoxy)ethyl maleate. The composition of these terpolymers ranges from a molar ratio of styrene to mono-maleate of 1:1 to a molar ratio of 1.6:1 and a molar ratio of mono-isobutyl maleate to mono-2-(n-butoxy)ethyl maleate in the range of 3:2 to 1:3. Preferably the molar ratio of styrene to monomaleate should be in the range of 1.1:1 to 1.3:1 and the molar ratio of mono-isobutyl maleate to mono-2-(n-butoxy)ethyl maleate should be in the range of 5.5:4.5 to 3.3:6.7 for a balance of processability and dimensional stability of a photoresist film containing the terpolymer as the binder.

The terpolymers may be prepared by any conventional free radical process which provides relatively high molecular weight terpolymers, preferably above a weight average molecular weight of 100,000 determined by size exclusion chromatography using tetrahydrofuran as solvent and low angle laser light scattering with a Waters Model 401 Differential Refractive Index Detector instrument. Preferably, the terpolymers are prepared by in situ esterification of maleic anhydride with a mixture of isobutyl alcohol and 2-(n-butoxy)ethanol followed by bulk polymerization of the mixture with styrene at a temperature in the range of 70 to 150° C using peroxide or hydroperoxide initiators or mixtures thereof, such as t-butyl peroctoate, benzoyl peroxide, t-butyl hydroperoxide, t-butyl peroxide, cumene hydroperoxide and cumene peroxide or azo-dinitriles such as azo-di(isobutyronitrile) and azo-di cyclohexanecarbonitrile).

The terpolymer is suitable for photoresist applications, since it is compatible with photochemically active agents such as diazonium salts and photochemically active oligomers such as polyacryloyl oligomers and photochemically active polymers such as poly(styrene-co-maleimide). Compatibility is determined by formulating the terpolymer with the photochemically active agent or polymer and compression molding the composition under a suitable pressure and at a suitable temperature, to provide a film of approximately 50 microns in thickness. The compression molded film should be homogeneous and free of voids or agglomerations upon visual inspection since discontinuities in the film destroy the photographic properties such as resolution and speed necessary for use as a photoresist. Also there should be little degradation of the photochemically active agent and little chemical change of the maleate units such as by de-esterification and formation of succinnic anhydride units which can deactivate photoinitiators and impair photoresponse. Such degradation or chemical change is determined by infrared analysis of the film.

In general dry-film photoresist compositions comprise a binder, a photochemically active agent or photochemically active monomer, oligomer or polymer, and an inhibitor. Photochemically active monomers, oligomers or polymers are usually activated with photoinitiators. Optionally fillers, viscosity modifiers or thixotropic agents, plasticizers, leveling agents, sensitizing agents and colorants may also be added.

Suitable photochemically active agents include diazonium salts. Suitable photochemically active monomers and oligomers include acrylate and methacrylate monomers and oligomers formulated with photoinitiators. The acrylate monomers and oligomers are selected from a large group of acryoyl and methacryloyl compounds conventionally used in such applications. Photoinitiators are those activated by actinic light and thermally inactive below 185° C. Preferably they are benzoin ethers such as benzoin isobutyl ether. Other initiators which may be used include polynuclear quinones such as 9,10-anthraquinone.

The dry photopolymerizable film is exposed to a source of actinic radiation. This may be through a tone image or a process transparency, e.g., a process negative or positive, stencil, or a mask. The exposure may also be through a continuous tone, negative or positive image. The exposure may be by the contact or projection method, with or without a cover sheet over the photopolymerizable layer or by projection using a cover sheet. These procedures are well known to those skilled in the art.

Since free-radical generating additionpolymerization initiators activatable by actinic radiation generally exhibit their maximum sensitivity in the ultraviolet range, the radiation source should furnish an effective amount of this radiation. Both point or broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sun lamps, are most suitable. In certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

The photopolymerizable compositions after exposure can be developed, e.g., by impingement of spray jets, with agitated immersion brushing or scrubbing to desirable images with aqueous bases, i.e., aqueous solutions of water-soluble bases in concentrations generally in the range from 0.01 to 10 percent by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; amines having a base ionization constant greater than about $1 \times 10^{-6}$, e.g., primary amines, such as, benzyl, butyl and allyl amines; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol; cyclic amines, e.g., morpholine, piperidine, piperazine, and pyridine; polyamines, such as hydrazine, ethylene and hexamethylene amines; the water-soluble basic salts, e.g., the carbonates and bicarbonates of the above amines; ammonium hydroxide and tetra-substituted ammonium hydroxides, e.g., tetramethyl-,tetraethyl-, trimethylbenzyl-, and trimethylphenylammonium hydroxides, sulfonium hydroxides, e.g., trimethyl-, diethylmethyl-, dimethylbenzylsulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; terra-substituted (preferably wholly alkyl) phosphonium, arsonium, and stibonium hydroxide, e.g., tetramethylphosphonium hydroxide.

The photopolymerized compositions can generally be removed by immersion in heated aqueous solutions of strong alkalies or, if desired, in proprietary stripping formulas well known in the art.

Practical and presently preferred embodiments of the present invention are shown for illustration in the following examples wherein parts and percentages are by weight unless otherwise indicated.

EXAMPLE 1

Preparation of a Terpolymer of Styrene. Mono-Isobutyl Maleate and Mono-2-(n-Butoxy)Ethyl Maleate.

Maleic anhydride (1019.1 gm, 10.4 mole), isobutanol (365.5 gm, 4.93 mole), and butyl Cellosolve (582.9 gm, 4.93 mole) are charged to a kettle. The reaction mixture is heated to 140° C. The solution begins to darken at 80° C. and becomes dark brown at 130° C. The kettle is maintained at 140° C. and a 30 to 40° C. exotherm is allowed to occur. The solution becomes yellow in color. The solution is cooled to 140° C. and stirred for an additional 1 hour. At the end of the esterification step, the solution is cooled to 50° C., and styrene (1189.6 gm 11.4 mole), tertbutyl peroxide (20.48 gm) are added. The reaction mixture is heated for 1.5 hour at 70° C., and subsequently transferred to a bulk polymerization reactor. The reactor is ramped from 70° C. to 95° C. during a 1½ hour period, 95° C. to 125° C. during a ½ hour period, 125° C. to 155° C. during an additional ½ period. At the end of the polymerization process, the polymer cake is crushed and ground. The yield is 3000 gm (94% yield). The weight average molecular weight of the material is found to be 180,000 by size exclusion chromatography. The mole ratio of styrene to maleate is 1.16 to 1 and the mole ratio of monoisobutyl maleate to mono-2-(n-butoxy)ethyl maleate is 1:1.

EXAMPLES 2 AND 3 AND COMPARATIVE EXAMPLES C1-C6

Terpolymers of styrene, mono-isobutyl maleate and mono-2-(n-butoxy)ethyl maleate are prepared by the process of Example 1, the ratio of styrene units to maleate units is 1.2. The ratio of mono-isobutyl maleate to mono-2-(n-butoxy)ethyl maleate is set forth in Table 1.

TABLE 1

| Example | Fusion Temperature °C. | Maleate Ratio of Terpolymers Mono-Isobutyl Maleate | Mono-2-(n-butoxy)-ethyl Maleate |
|---|---|---|---|
| 1 | 90 | 50 | 50 |
| 2 | 90 | 30 | 70 |
| 3 | 90 | 33 | 67 |
| C-1 | 90 | 0 | 100 |
| C-2 | 90 | 10 | 90 |
| C-3 | 90 | 20 | 80 |
| C-4 | 120 | 70 | 30 |
| C-5 | 120 | 90 | 10 |
| C-6 | 140 | 100 | 0 |

All the terpolymers are intimately mixed with 4-diazo-N,N-diethylaniline tetrafluoroborate in weight ratio of 10 grams to 2.6 grams (0.01 mole) and the mixtures are compression molded on a hydraulic press at a pressure of 2.76MPa and at an appropriate fusion temperature. The compression molded terpolymer examples are homogeneous, free of voids and agglomerations and non-tacky and show no evidence of decomposition of the diazonium salt or the terpolymer. Comparative examples Cl to C3 are tacky and exhibit severe agglomeration. Comparative examples C4 to C6 are non-homogeneous and show by infrared-red analysis considerable decomposition of the diazonium salt and cyclization of the maleate units to form anhydride.

The film obtained from Example 1 demonstrated its suitability as a positive working photoresist. The film is placed in a Rayonet Photochemical Reactor supplied by The Southern New England Ultraviolet Company, providing UV light of wavelength 360 nm at an intensity of 213 mW cm$^{-2}$ to the film. In contrast to unexposed film, the exposed film dissolves readily in 1 weight percent sodium bicarbonate solution.

The terpolymers of Example 1 and Comparative Examples Cl and C6 are intimately blended with a photochemically active copolymer of styrene and maleimide in the weight ratio of 4:1 parts by weight. The blends are compression molded into films of 50 micron thickness. Only the blend of Example 1 is soluble in organic solvents and aqueous bases allowing it to be used in photoresist applications.

What is claimed is:

1. A terpolymer of styrene, mono-isobutyl maleate and mono-2-(n-butoxy)ethyl maleate wherein the ratio of styrene units to maleate units is in the range of about 1:1 to about 1.6:1 and wherein the ratio of mono-isobutyl maleate units to mono-2-(n-butoxy)ethyl maleate units is in the range of about 3:2 to about 1:3 and wherein the weight average molecular weight is greater than about 100,000 daltons.

2. The terpolymer of claim 1 wherein the ratio of styrene units to maleate units is in the range of about 1.1:1 to about 1.3:1 and wherein the ratio of mono-isobutyl maleate units to mono-2-(nbutoxy)ethyl maleate units is in the range of about 5.5:4.5 to about 3.3:6.7.

3. The terpolymer of claim 1 wherein the ratio of styrene units to maleate units is about 1.2 and the ratio of mono-isobutyl maleate units to mono-2-(n-butoxy) ethyl maleate units is about 1:1.

4. A photoresist composition comprising either a photochemically active agent or photochemically active monomer, oligomer or polymer and the terpolymer of claim 1 as an alkali soluble binder.

5. A photoresist composition comprising either a photochemically active agent or photochemically active monomer, oligomer or polymer and the terpolymer of claim 2 as an alkali soluble binder.

6. A photoresist composition comprising either a photochemically active agent or photochemically active monomer, oligomer or polymer and the terpolymer of claim 3 as an alkali soluble binder.

* * * * *